United States Patent [19]
Kimura

[11] Patent Number: 5,148,253
[45] Date of Patent: Sep. 15, 1992

[54] LIGHT-TRIGGERED SWITCHING CIRCUIT

[75] Inventor: Akihiro Kimura, Kitakyushu, Japan

[73] Assignee: Kabushiki Kaisha Toshiba, Kawasaki, Japan

[21] Appl. No.: 742,583

[22] Filed: Aug. 7, 1991

Related U.S. Application Data

[63] Continuation of Ser. No. 513,972, Apr. 24, 1990, abandoned.

[30] Foreign Application Priority Data

Apr. 28, 1989 [JP] Japan .................. 1-107563

[51] Int. Cl.$^5$ .................. H01L 29/74; H01L 27/14; H03K 17/292; H03K 17/60
[52] U.S. Cl. .................. 357/38; 357/30; 357/41; 307/570; 307/630
[58] Field of Search .................. 357/39, 38 LA, 38 R, 357/30.0; 307/637, 630, 570

[56] References Cited

U.S. PATENT DOCUMENTS

| | | | |
|---|---|---|---|
| 4,039,863 | 8/1977 | Ohhinata et al. | 307/252 A |
| 4,212,024 | 7/1980 | Sugawara et al. | 357/38 |
| 4,224,634 | 9/1980 | Suedberg | 357/38 |
| 4,365,170 | 12/1982 | Okuhara | 357/38 |
| 4,509,069 | 4/1985 | Stoisiek | 357/38 |

FOREIGN PATENT DOCUMENTS

| | | |
|---|---|---|
| 0268430 | 5/1988 | European Pat. Off. |
| 58-132971 | 8/1983 | Japan ..................... 357/30 |
| WO8302852 | 8/1983 | PCT Int'l Appl. .................. 357/30 |
| 631833 | 8/1982 | Switzerland. |

OTHER PUBLICATIONS

Patent Abstracts of Japan vol. 3, No. 58 (E-111) May 18, 1979, JP A-5437461 published Mar. 19, 1979 to (Hitachi Seisakusho K.K.).

Primary Examiner—Rolf Hille
Assistant Examiner—Mahshid Saadat
Attorney, Agent, or Firm—Finnegan, Henderson, Farabow, Garrett and Dunner

[57] ABSTRACT

A light-triggered switching circuit which comprises a PNPN element, a resistor, and control means. The PNPN element is made of a P-type emitter layer, an N-type base layer, a P-type base layer, and an N-type emitter layer. The resistor is connected between the P-type base layer and the N-type emitter layer. The control means is connected between the P-type emitter layer and the N-type emitter layer. It controls the PNPN element such that the PNPN element performs a switching operation only when a voltage applied between the P-type emitter layer and the N-type emitter layer is lower than a predetermined value while a first amount of light is being applied to the PNPN element, and is also performs a switching operation, regardless of the value of the voltage applied between the P-type emitter layer and the N-type emitter layer, while a second amount of light, different from the first amount of light, is being applied to the PNPN element.

28 Claims, 12 Drawing Sheets

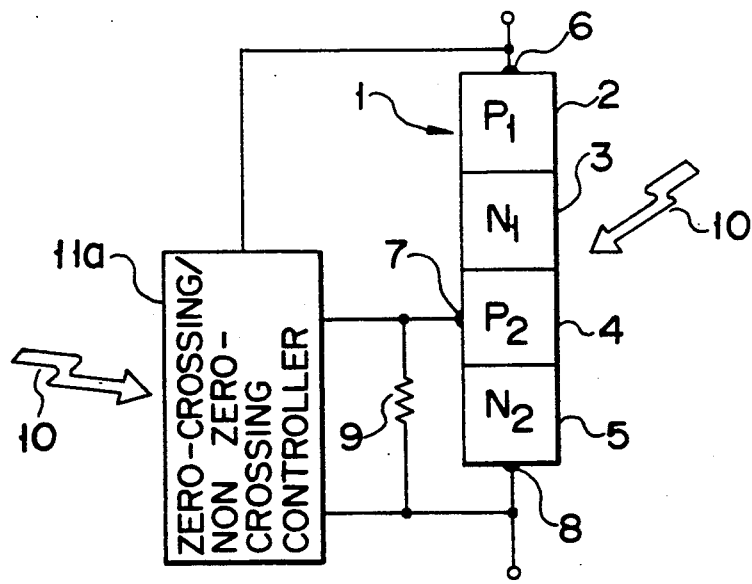
F I G. 3
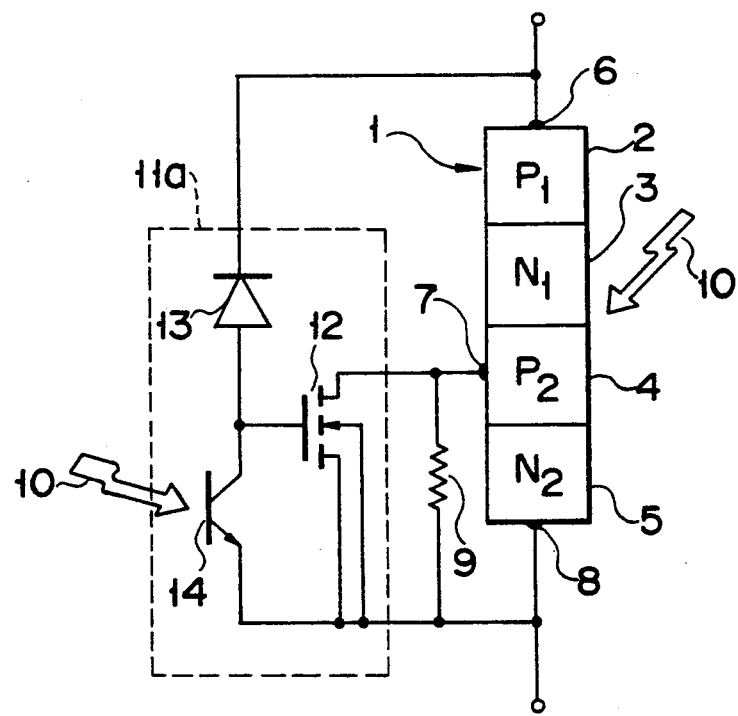
F I G. 4

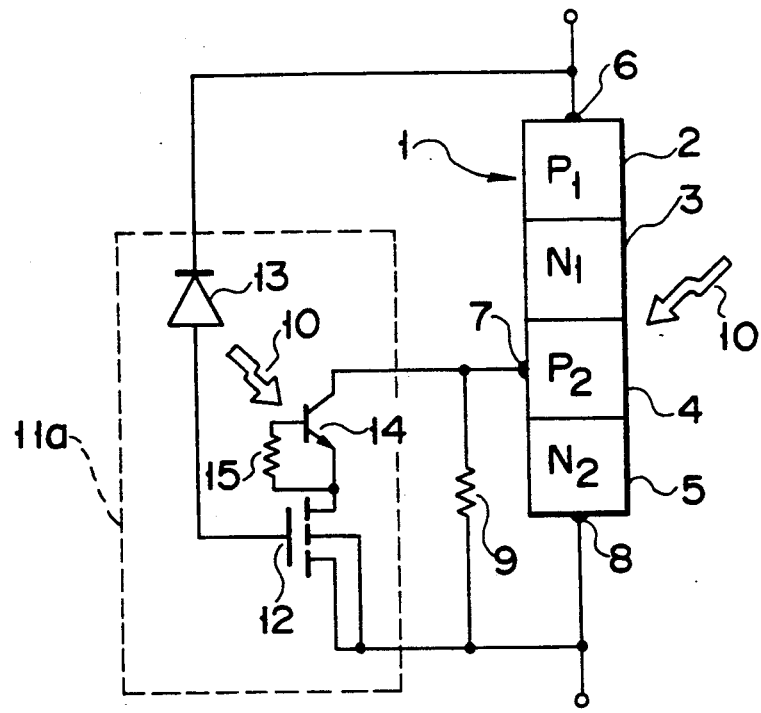
F I G. 7
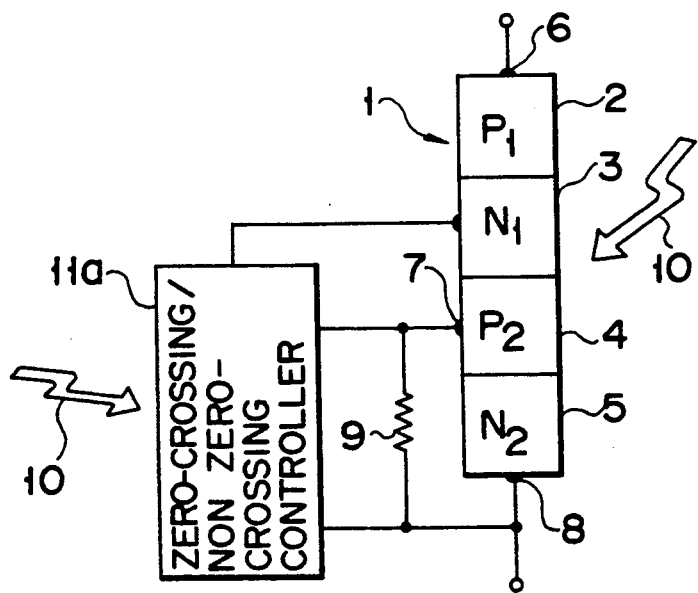
F I G. 8

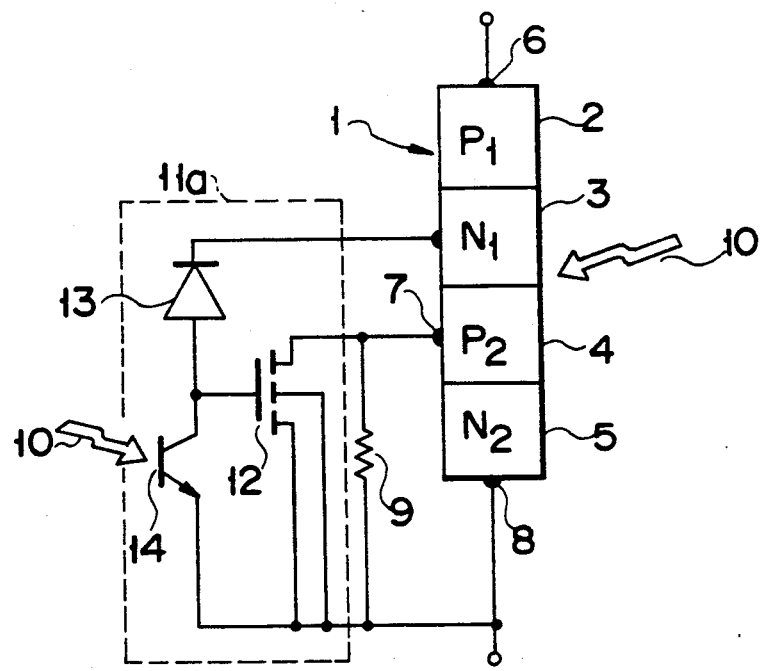
F I G. 9
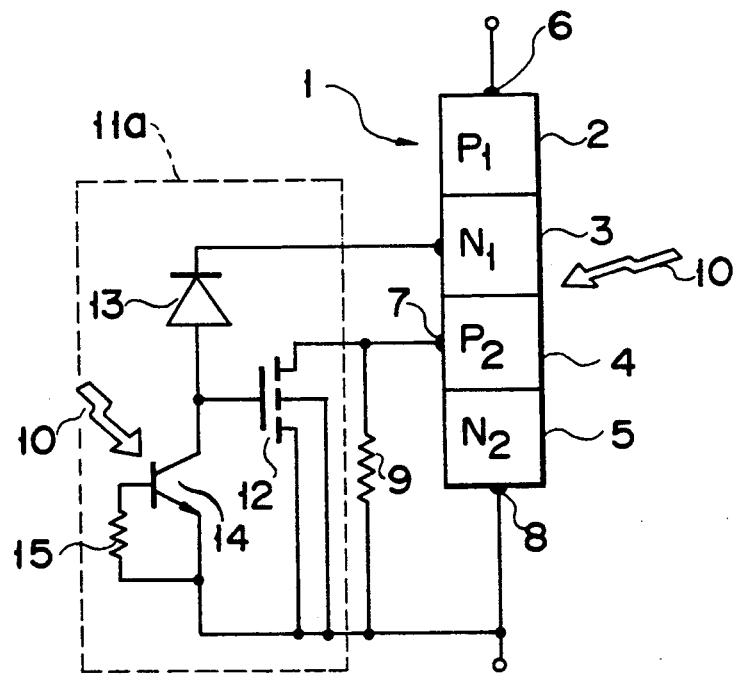
F I G. 10

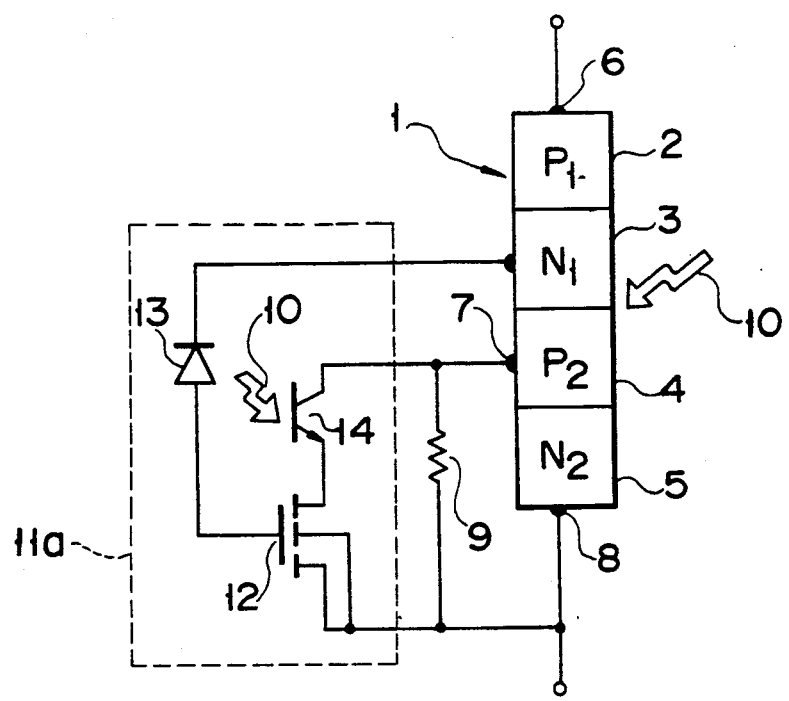
F I G. 11
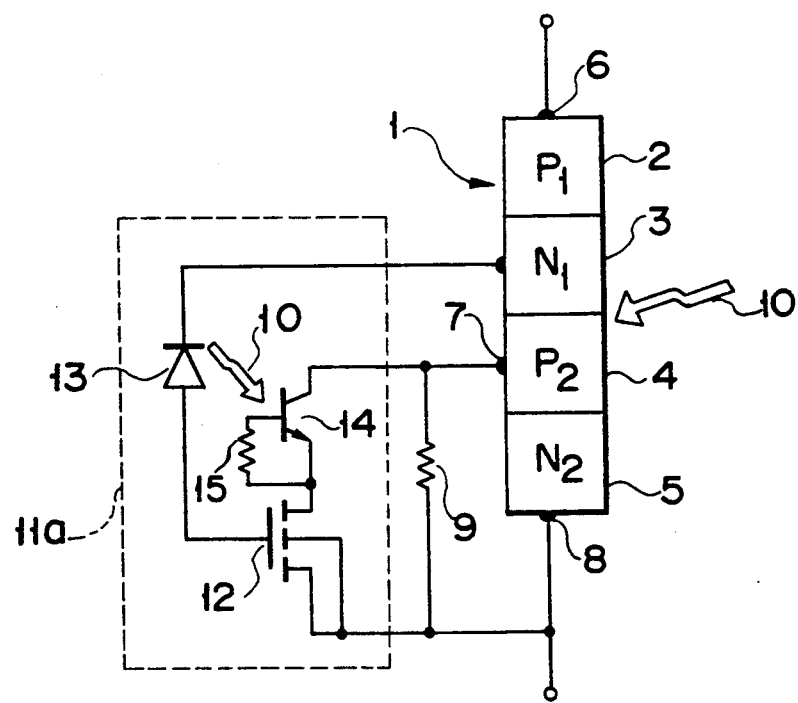
F I G. 12

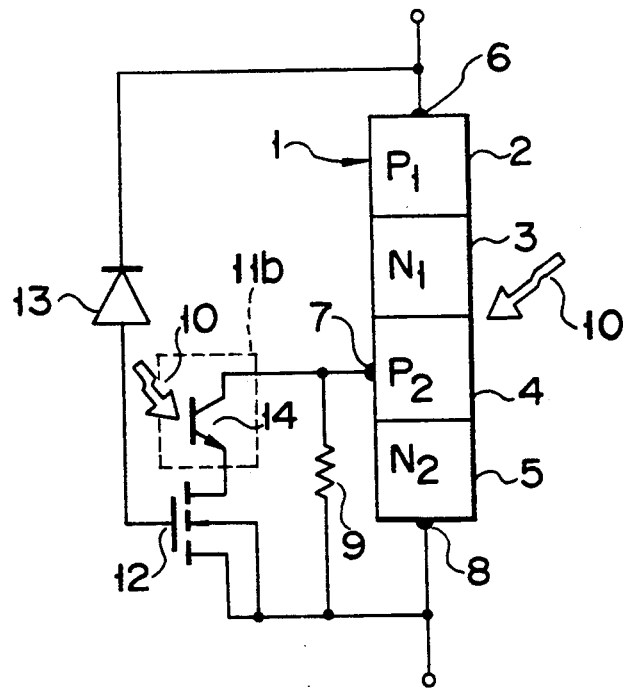
F I G. 17
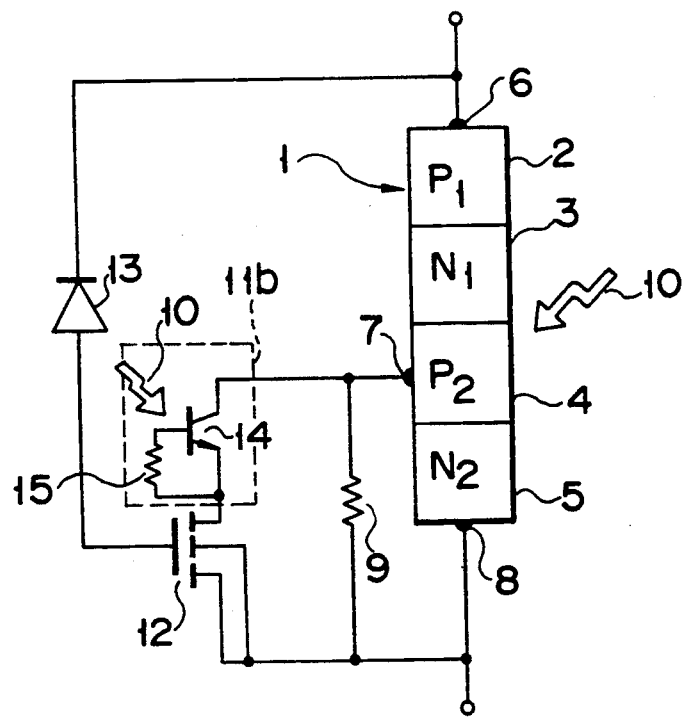
F I G. 18

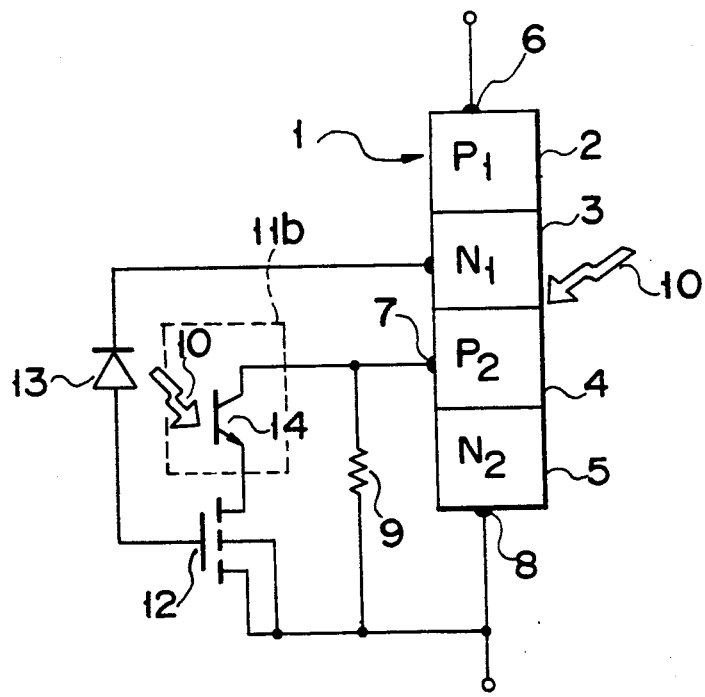
F I G. 23
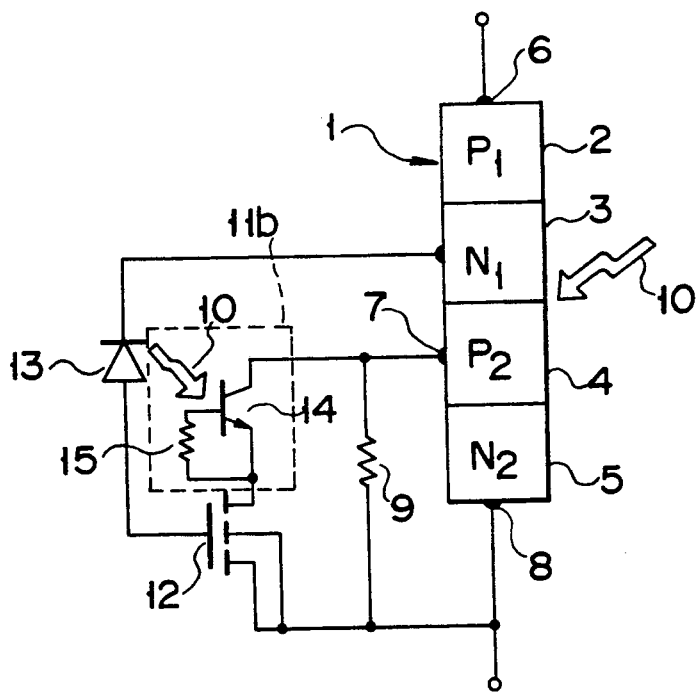
F I G. 24

LIGHT-TRIGGERED SWITCHING CIRCUIT

This application is a continuation of application Ser. No. 07/513,972, filed Apr. 24, 1990, now abandoned.

BACKGROUND OF THE INVENTION

1. Field of the Invention

The present invention relates to an improvement of a light-triggered switching circuit such as a photo SCR (Silicon Controlled Rectifier) or a photo triac, either having light-driven PNPN elements.

2. Description of the Related Art

In general, light-triggered switching circuits comprise light-driven PNPN elements. Among these circuits are the light-activated SCRs shown in FIGS. 1 and 2, which are widely used as high-voltage relays wherein the current-supplying section and the control section must be insulated from each other. More specifically, the photo SCR shown in FIG. 1 comprises a PNPN element 21 and a resistor 30. The PNPN element 21 consists of a P-type emitter layer 22, an N-type base layer 23, a P-type base layer, an N-type emitter layer, an anode 26, a gate 27, and a cathode 28. The resistor 30 is used to adjust the sensitivity which the element 21 exhibits with respect to a light beam 29. The photo SCR illustrated in FIG. 2 is identical to the photo SCR shown in FIG. 1, except that a circuit 31 is provided in addition to a PNPN element 21 and a resistor 30. The circuit 31 comprises an N-channel MOSFET 32 and an PN-junction diode 33.

The operation of the photo SCR shown in FIG. 1 will be explained. When a light beam 29 is applied to the PNPN element 21 while a voltage is being applied to the anode 26, a current flows between the anode 26 the cathode 28. Whatever voltage is applied across the PNPN element 21, the photo SCR performs a switching operation. This photo SCR will, therefore, be referred to as "non-zero-crossing photo SCR" hereinafter.

The light-activated photo SCR shown in FIG. 2 is designed to perform a switching operation when the voltage applied between the anode 26 and the cathode 28 falls below a predetermined value (i.e., near 0 volt). The photo SCR will, thus, be referred to as "zero-crossing photo SCR" hereinafter. To be more precise, when the voltage applied between the gate and source of the N-channel MOSFET 32 falls below the threshold value ($V_{TH}$) thereof, this MOSFET 32 is turned off. As a result, it is only the resistor 30 which is connected between the gate 27 and the cathode 28. In this case, the zero-crossing photo SCR becomes equivalent, in structure, to the non-zero-crossing photo SCR shown in FIG. 1. On the other hand, when the voltage applied between the gate and source of the MOSFET 32 rises above the threshold value thereof, the MOSFET 32 is turned on. The gate 27 and the cathode 28 are thus short-circuited Therefore, the carrier, which has been generated from the light 29 applied to the PNPN element 21, flows to the cathode 28 through the MOSFET 32. As a result of this, the zero-crossing photo SCR is not turned on.

All light-triggered switching circuits hitherto known are classified into the aforementioned two types, i.e., the zero-crossing photo SCR and the non-zero-crossing photo SCR. There has been provided no light-triggered switching circuits which performs the functions of both types of photo SCRs. Inevitably, the users must choose either a zero-crossing photo SCR or a non-zero-crossing photo SCR, in accordance with a specific use.

SUMMARY OF THE INVENTION

Accordingly, the object of the present invention is to provide a light-triggered switching circuit which performs both the function of a zero-crossing photo SCR and that of a non-zero-crossing photo SCR.

According to a first aspect of the invention, there is provided a light-triggered switching circuit which comprises: a PNPN element made of a P-type emitter layer, an N-type base layer, a P-type base layer, and an N-type emitter layer; a resistor connected between the P-type base layer and the N-type emitter layer; and control means connected between the P-type emitter layer and the N-type emitter layer, for controlling the PNPN element such that the PNPN element performs a switching operation only when a voltage applied between the P-type emitter and the N-type emitter layer is lower than a predetermined value while a first predetermined amount of light is being applied to the PNPN element, and also performs a switching operation, regardless of the value of the voltage applied between the P-type emitter layer and the N-type emitter layer, while a first amount of light, different from the second amount of light, is being applied to the PNPN element.

According to a second aspect of this invention, there is provided a light-triggered switching circuit which comprises: a PNPN element made of a P-type emitter layer, an N-type base layer, a P-type base layer, and an N-type emitter layer; a resistor connected between the P-type base layer and the N-type emitter layer; a MOSFET having a gate, a drain connected to the P-type base layer, and a source connected to the N-type emitter; a diode connected between the P-type emitter layer and the gate of the MOSFET; and control means connected between the gate and source of the MOSFET, for controlling the PNPN element such that a switching operation is performed, regardless of the value of a voltage applied between the P-type emitter layer and the N-type emitter layer, while a first predetermined amount of light is being applied to the PNPN element, and is also performed only when the voltage applied between the P-type emitter layer and the N-type emitter layer is lower than a predetermined value while a second amount of light, different from the first amount of light, is being applied to the PNPN element.

According to a third aspect of the invention, there is provided a light-triggered switching circuit which comprises: a PNPN element made of a P-type emitter layer, an N-type base layer, a P-type base layer, and an N-type emitter layer; a resistor connected between the P-type base layer and the N-type emitter layer; a MOSFET having a gate, a drain, and a source connected to the N-type emitter layer; a diode connected between the P-type emitter layer and the gate of the MOSFET; and control means connected between the P-type base layer and the drain of the MOSFET, for controlling the PNPN element such that a switching operation is performed only when a voltage applied between the P-type emitter and the N-type emitter layer is lower than a predetermined value while a first predetermined amount of light is being applied to the PNPN element, and is also performed, regardless of the value of the voltage applied between the P-type emitter layer and the N-type emitter layer, while a second amount of light, different from the first amount of light, is being applied to the PNPN element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing a light-triggered switching circuit according to a first embodiment of the present invention;

FIGS. 4 to 7 show, in detail, various zero-crossing/non-zero-crossing controllers which can be incorporated in the circuit shown in FIG. 3;

FIG. 8 is a diagram illustrating a light-triggered switching circuit according to a second embodiment of the invention;

FIGS. 9 to 12 illustrate, in detail, various zero-crossing/non-zero-crossing controllers which can be incorporated in the circuit shown in FIG. 8;

FIGS. 17 and 18 illustrate, in detail, zero-crossing/non-zero-crossing controllers which can be use in the circuit shown in FIG. 16;

FIGS. 23 and 24 show, in detail, zero-crossing/non-zero-crossing controllers which can be incorporated in the circuit illustrated in FIG. 22.

DETAILED DESCRIPTION OF THE PREFERRED EMBODIMENTS

Figure 1:
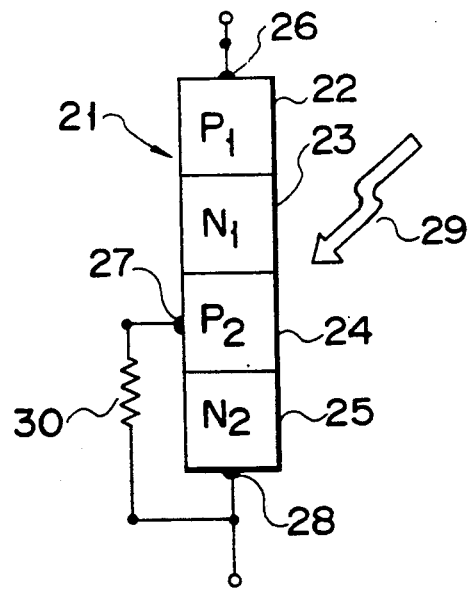
FIG. 1 is a diagram showing a conventional light-triggered switching circuit which performs non-zero-crossing function.

Light-triggered switching circuits according to the preferred embodiments of the present invention will now be described in detail, with reference to the accompanying drawings. In each figure, the same reference numerals designate the same components as those shown in any other figure; and those of the components of the second et seq. embodiments, which are identical to some of the components of the first embodiment will not be described in detail.

FIG. 3 is a diagram illustrating a light-triggered switching circuit according to a first embodiment of the present invention. As FIG. 3 shows, the switching circuit comprises a PNPN element 1, a resistor 9, and a zero-crossing/non-zero-crossing controller 11a. The PNPN element 1 is formed of a P-type emitter layer 2, an N-type base layer 3, a P-type base layer 4, and an N-type emitter layer 5. The P-type emitter 2, the P-type base layer 4, and the N-type emitter layer 5 function as anode 6, gate 7 and cathode 8 of the PNPN element 1. The resistor 9, which is connected between the gate 7 and cathode 8 of the PNPN element 1, for controlling the photosensitivity of the PNPN element 1. The PNPN element 1 and the resistor 9 constitute a photo SCR which performs a non-zero-crossing operation. The zero-crossing/non-zero-crossing controller 11a has three terminals coupled to the anode 6, gate 7 and cathode 8 of the PNPN element 1, respectively, for causing the photo SCR to perform a zero-crossing operation, in accordance with the amount of light 10 applied to it.

Light 10 is applied from a light source (not shown) to the PNPN element 1 to trigger the switching circuit. Needless to say, the amount of light applied must be great enough to trigger the PNPN element 1. The light is also applied to the zero-crossing/non-zero-crossing controller 11a. The controller 11a determines whether or not the amount of light is equal to or greater than a reference value. The controller 11a causes the photo SCR to perform either a non-zero-crossing operation or a zero-crossing operation in accordance with the amount of light applied to the switching circuit.

FIGS. 4 to 7 illustrate, in detail, various zero-crossing/non-zero-crossing controllers which can be incorporated in the light-triggered switching circuit illustrated in FIG. 3. These controllers will be described, one by one.

The zero-crossing/non-zero-crossing controller shown in FIG. 4 comprises an N-channel MOSFET 12, an PN-junction diode 13, and an NPN-type phototransistor 14. The drain and source of the MOSFET 12 are coupled to the gate 7 and cathode 8 of an PNPN element 1, respectively. The gate of the MOSFET 12 is connected by the diode 13 to the anode 6 of the PNPN element 1, and also to the collector of the phototransistor 14. The emitter of the phototransistor 14 is connected to the source of the MOSFET 12.

Light 10 is applied from a light source (not shown) to both the PNPN element 1 and the base of the phototransistor 14. More light is required to trigger the phototransistor 14 than to trigger the PNPN element 1. More precisely, the phototransistor 14 is turned on when applied with light several times as much as the light required to trigger the PNPN element 1.

Figure 2:
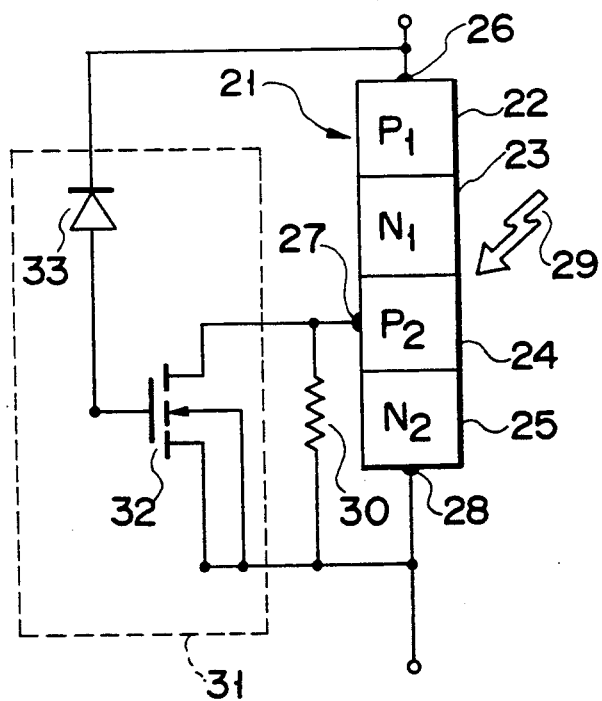
FIG. 2 is a diagram illustrating a conventional light-triggered switching circuit which performs zero-crossing function.

Hence, to make the light-triggered switching circuit (FIG. 4) perform a zero-crossing operation, it is necessary to turn the PNPN element 1 and the phototransistor 14 on and off, respectively. To turn the element 1 on and the phototransistor 14 off, it suffices to apply light intense enough to turn on the PNPN element 1 but not so intense as to turn on the phototransistor 14 (hereinafter called "low-intensity light"). When the phototransistor 14 is illuminated with the low-intensity light, the gate-source path of the MOSFET 12 is cut, whereby the circuit becomes equivalent to the light-triggered switching circuit illustrated in FIG. 2. Hence, while the low-intensity light is applied to the circuit, the PNPN element 1 performs a switching operation only when the voltage applied between the anode 6 and the cathode 8 is less than a predetermined value, that is, only when the gate-source voltage of the MOSFET 12 is less than the threshold voltage of the MOSFET 12.

In order to make the light-triggered switching circuit (FIG. 4) perform a non-zero-crossing operation, it is necessary to turn on both the PNPN element 1 and the phototransistor 14. To turn on the element 1 and the phototransistor 14, it suffices to apply light intense enough to turn on the PNPN element 1 and the phototransistor 14 (hereinafter called "high-intensity light"). When the phototransistor 14 is illuminated with the high-intensity light, the gate-source path of the MOSFET 12 is short-circuited, the MOSFET is turned off. As a result, the circuit becomes equivalent to the light-triggered switching circuit shown in FIG. 1. Hence, while the high-intensity light is applied to the circuit, the PNPN element 1 performs a switching operation, regardless of the value of the voltage applied between the anode 6 and the cathode 8.

As may be understood from the above, the light-triggered switching circuit performs either the non-zero-crossing operation or the zero-crossing operation in accordance with the intensity of light 10 applied to it.

Figure 5:
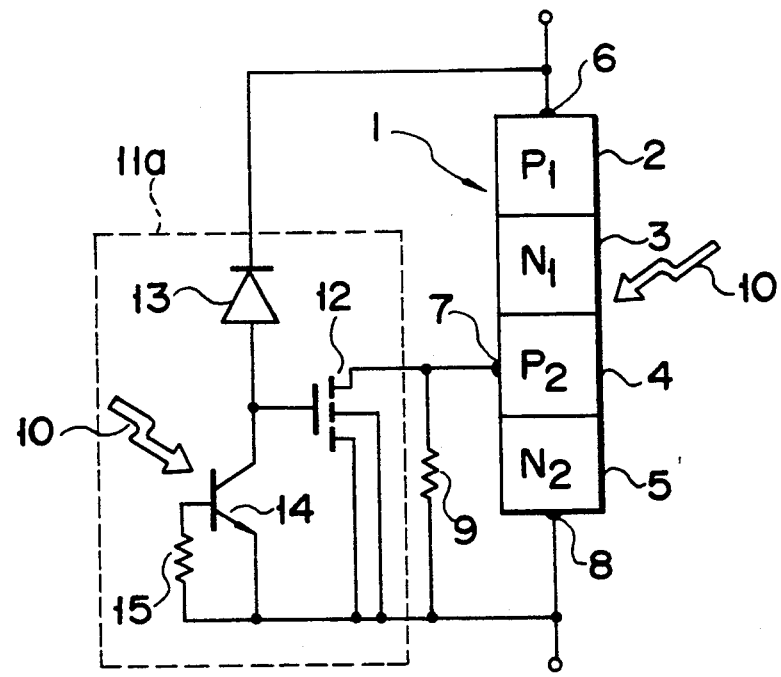

The zero-crossing/non-zero-crossing controller shown in FIG. 5 is identical to that one shown in FIG. 4, except that a resistor 15 is connected between the base and emitter of the NPN phototransistor 14, for controlling the base current of the phototransistor 14.

Figure 6:
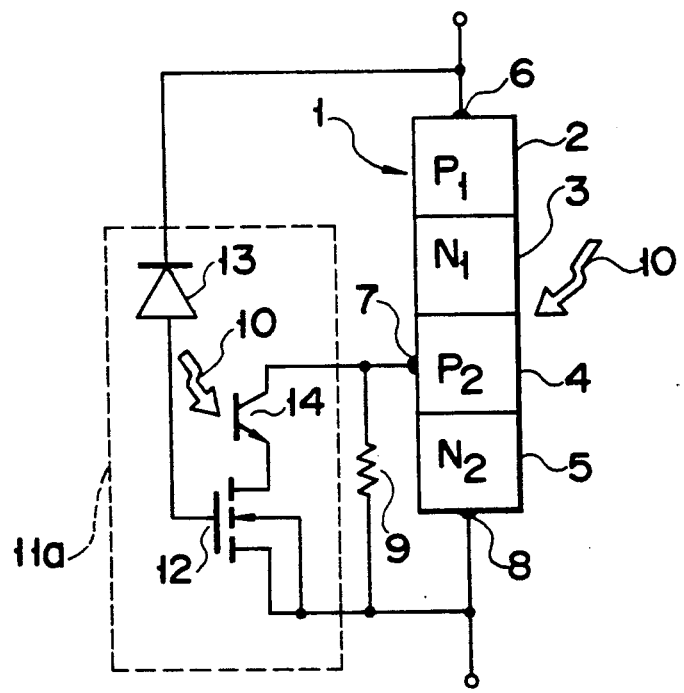

The zero-crossing/non-zero-crossing controller shown in FIG. 6 comprises an N-channel MOSFET 12, a PN-junction diode 13, and an NPN-type phototransistor 14. The drain and source of the MOSFET 12 are coupled to the gate 7 and cathode 8 of a PNPN element 1, respectively. The gate of the MOSFET 12 is connected by the diode 13 to the anode 6 of the PNPN element 1. The collector of the NPN phototransistor 14 is connected to the gate 7 of the PNPN element 1.

Also with the light-triggered switching circuit shown in FIG. 6, light 10 is applied from a light source (not shown) to both the PNPN element 1 and the base of the phototransistor 14. More light is required to trigger the phototransistor 14 than to trigger the PNPN element 1. More precisely, the phototransistor 14 is turned on when applied with light several times as much as the light required to trigger the PNPN element 1.

Hence, to make the light-triggered switching circuit (FIG. 6) perform a non-zero-crossing operation, it is suffices to apply low-intensity light. When the phototransistor 14 is illuminated with the low-intensity light, the gate-source path of the MOSFET 12 is cut, whereby the circuit becomes equivalent to the light-triggered switching circuit illustrated in FIG. 1. Hence, while the low-intensity light is applied to the circuit, the PNPN element 1 performs a switching operation, regardless of the value of the voltage applied between the anode 6 and the cathode 8.

In order to make the light-triggered switching circuit (FIG. 6) perform a zero-crossing operation, it suffices to apply high-intensity light to the switching circuit. While the high-intensity light is being applied to the circuit, the PNPN element 1 performs a switching operation only when the voltage applied between the anode 6 and the cathode 8 is less than a predetermined value, that is, only when the gate-source voltage of the MOSFET 12 is less than the threshold voltage of the transistor 12.

As may be understood from the above, the light-triggered switching circuit performs either the non-zero-crossing operation or the zero-crossing operation in accordance with the intensity of light 10 applied to it.

The zero-crossing/non-zero-crossing controller shown in FIG. 7 is identical to that one shown in FIG. 6, except that a resistor 15 is connected between the base and emitter of the NPN phototransistor 14, for controlling the base current of the phototransistor 14.

FIG. 8 is a diagram illustrating a light-triggered switching circuit according to a second embodiment of the present invention. As FIG. 8 shows when reviewed in comparison with FIG. 3, this switching circuit differs from the circuit shown in FIG. 3 in that one of the three terminals of the zero-crossing/non-zero-crossing controller 11a is connected to the N-type base layer 3 (not to the anode 6) of the PNPN element 1, whereas the remaining two terminals are connected to the p-type base layer 4 and cathode 8 of the PNPN element 1, respectively, as in the switching circuit shown in FIG. 3.

FIGS. 9 to 12 illustrate, in detail, various zero-crossing/non-zero-crossing controllers which can be used in the light-triggered switching circuit shown in FIG. 8.

The zero-crossing/non-zero-crossing controller 11a shown in FIG. 9 comprises an N-channel MOSFET 12, a PN-junction diode 13, and an NPN-type phototransistor 14. The drain and source of the MOSFET 12 are connected to the gate 7 and cathode 8 of a PNPN element 1, respectively. The gate of the MOSFET 12 is coupled to the N-type layer 3 of the PNPN element 1 by the PN-junction diode 13, and also to the collector of the phototransistor 14. The emitter of the phototransistor 14 is connected to the source of the MOSFET 12.

The zero-crossing/non-zero-crossing controller 11a illustrated in FIG. 10 is identical to that one shown in FIG. 9, except that a resistor 15 is connected between the base and emitter of the NPN phototransistor 14, for controlling the photosensitivity of the phototransistor 14.

The zero-crossing/non-zero-crossing controller 11a shown in FIG. 11 is characterized in three respects. First, the drain and source of an N-channel MOSFET 12 are connected to the emitter of an NPN-type phototransistor 14 and the cathode 8 of an PNPN element 1. Secondly, the gate of the MOSFET 12 is coupled to the N-type base layer 3 of the PNPN element 1 by a PN-junction diode 13. Thirdly, the collector of the phototransistor 14 is connected to the gate 7 of the PNPN element 1.

The zero-crossing/non-zero-crossing controller 11a shown in FIG. 12 is identical to the controller shown in FIG. 11, except that a resistor 15 is connected between the base and emitter of the NPN-type phototransistor 14, for controlling the photosensitivity of the phototransistor 12.

Figure 13:
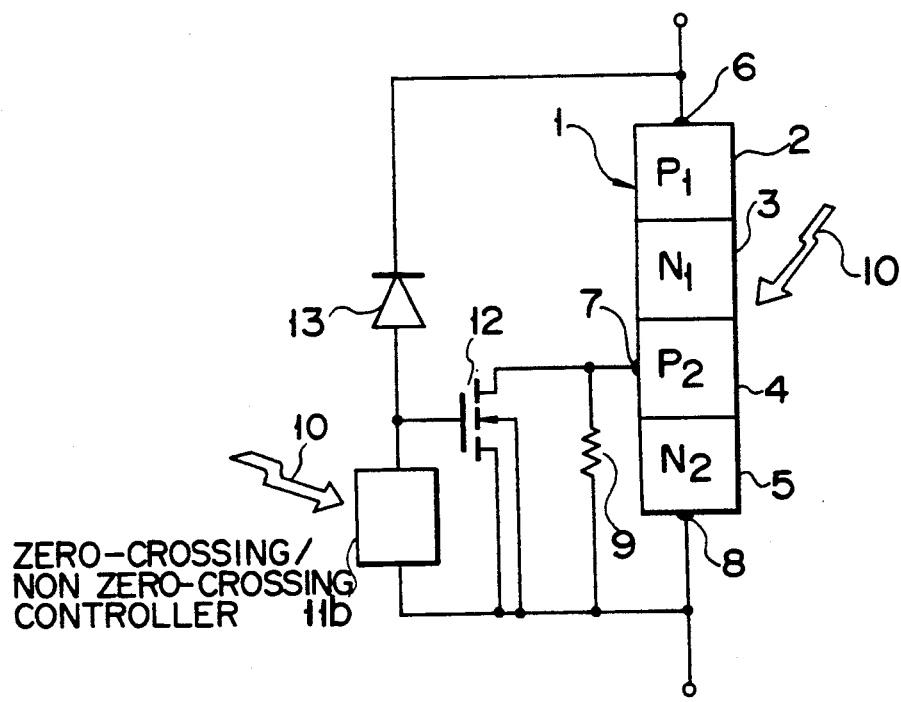
FIG. 13 is a diagram illustrating a light-triggered switching circuit according to a third embodiment of this invention.

FIG. 13 illustrates a light-triggered switching circuit according to a third embodiment of the present invention. As this figure show, the circuit comprises a PNPN element 1, a resistor 9, a zero-crossing/non-zero-crossing controller 11b, an N-channel MOSFET 12, and a PN-junction diode 13. The PNPN element 1 is made of a P-type emitter layer 2, an N-type base layer 3, a P-type base layer 4, and an N-type emitter layer 5. The P-type emitter layer 2, the P-type base layer 4, and the N-type emitter layer 5 function as the anode 6, gate 7 and cathode 8 of the PNPN element 1, respectively. The resistor 9 is coupled between the gate 7 and cathode 8 of the PNPN element 1, for adjusting the photosensitivity of the gate 7 of the PNPN element 1. The drain of the MOSFET 12 is connected to the anode 6 of the PNPN element 1 by the PN-junction diode 13. The light-activated PNPN element 1, the photosensitivity-adjusting resistor 9, the N-channel MOSFET 12, and the PN-junction diode 13 constitute a light-activated SCR which performs a zero-crossing operation. The zero-crossing/non-zero-crossing controller 11b is connected between the gate and source of the MOSFET 12, for causing the SCR to perform either a zero-crossing operation or a non-zero-crossing operation in accordance with the amount of light 10 applied to the switching circuit.

Light 10 is applied a light source (not shown) to the PNPN element 1 to trigger the switching circuit. Needless to say, the amount of light applied must be great enough to trigger the PNPN element 1. The light is also applied to the zero-crossing/non-zero-crossing controller 11b. The controller 11b determines whether or not the amount of light is equal to or greater than a reference value. The controller 11b causes the light-activated SCR to perform either a non-zero-crossing operation or a zero-crossing operation, in accordance with the amount of light 10 applied to the switching circuit.

Figure 14:
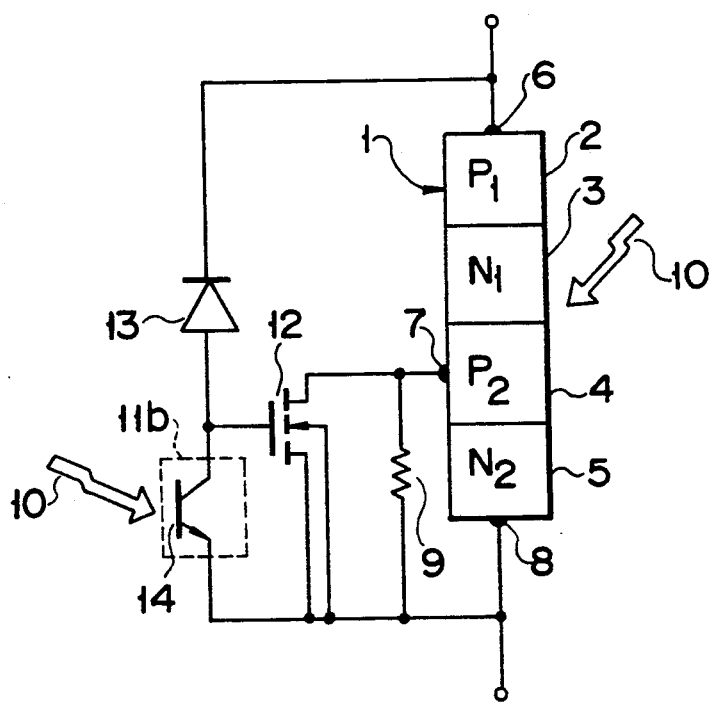
FIGS. 14 and 15 show, in detail, zero-crossing/non-zero-crossing controllers which can be incorporated in the circuit illustrated in FIG. 13.
Figure 15:
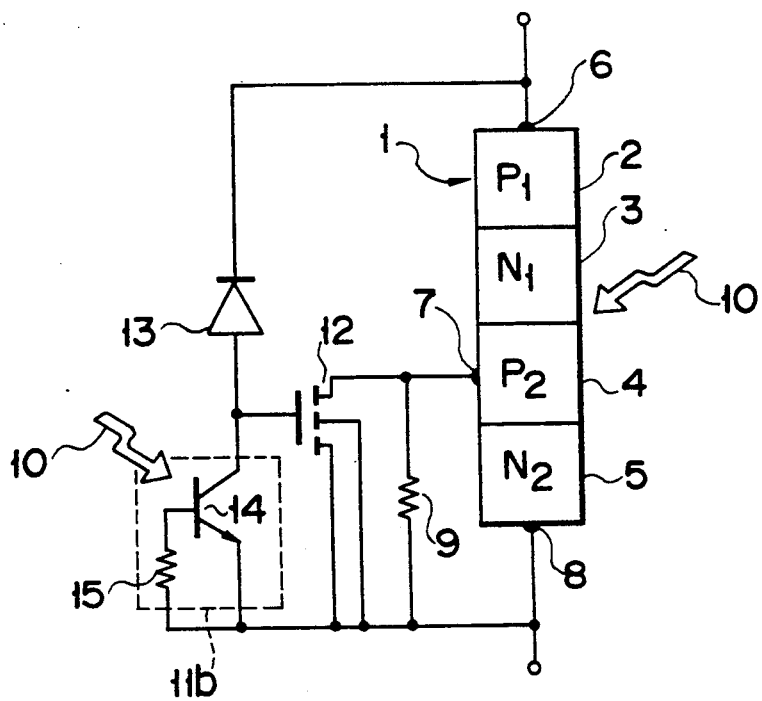

FIGS. 14 and 15 show zero-crossing/non-zero-crossing controllers which can be incorporated in the light-triggered switching circuit illustrated in FIG. 13.

The controller 11b shown in FIG. 14 comprises an NPN phototransistor 14 having a collector connected to the gate of an N-channel MOSFET 12, and an emitter connected to the source of the MOSFET 12.

The controller 11b illustrated in FIG. 15 comprises an NPN-type phototransistor 14 and a resistor 15. The collector and emitter of the phototransistor 14 are coupled to the gate and source of an N-channel MOSFET 12, respectively. The resistor 15 is connected between the base and emitter of the NPN-type phototransistor 14, for adjusting the photosensitivity of the phototransistor 14.

Figure 16:
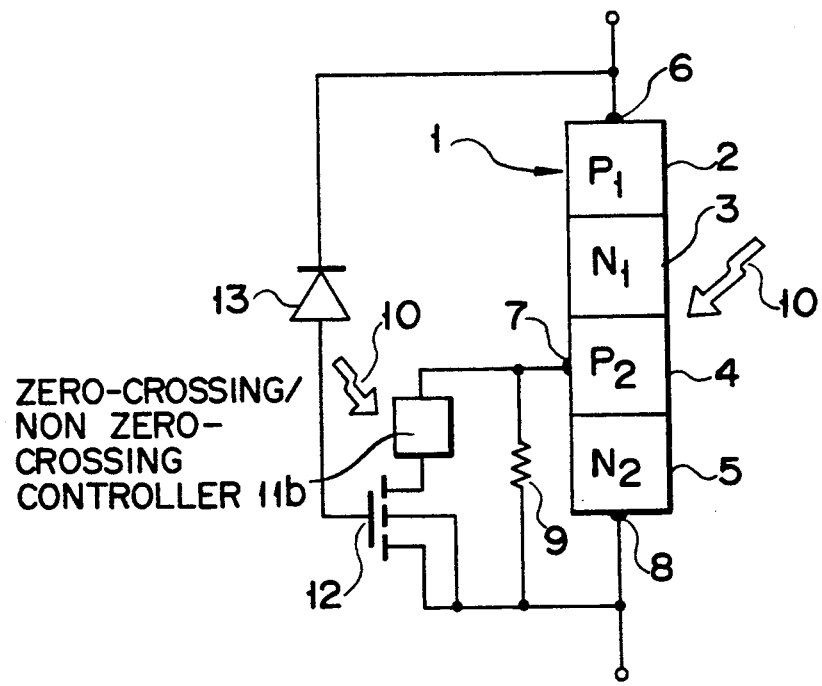
FIG. 16 is a diagram showing a light-triggered switching circuit according to a fourth embodiment of the present invention.

FIG. 16 is a circuit diagram showing a light-triggered switching circuit according to a fourth embodiment of the invention. As is evident from FIG. 16, the circuit comprises a light-activated PNPN element 1, a resistor 9, a zero-crossing/non-zero-crossing controller 11b, an N-channel MOSFET 12, and a PN-junction diode 13. The resistor 9 is connected between the gate 7 and cathode 8 of the PNPN element 1, for controlling the photosensitivity of the gate 7. The source of the MOSFET 12 is connected to the cathode 8 of the PNPN element 1. The gate of the MOSFET 12 is connected to the anode 6 of the PNPN element 1 by the PN-junction diode 13. The zero-crossing/non-zero-crossing controller 11b is connected between the drain of the MOSFET 12 and the gate 7 of the PNPN element 1.

FIGS. 17 and 18 show, in detail, zero-crossing/non-zero-crossing controllers which can be used in the light-triggered switching circuit illustrated in FIG. 16.

The controller 11b shown in FIG. 17 comprises an NPN-type phototransistor 14 having an emitter connected to the drain of an N-channel MOSFET 12, and a collector connected to the gate 7 of a PNPN element 1.

The controller 11b shown in FIG. 18 is identical to the controller shown in FIG. 17, except that a resistor 15 is connected between the base and emitter of the NPN-type phototransistor 14, for controlling the photosensitivity of the phototransistor 14.

Figure 19:
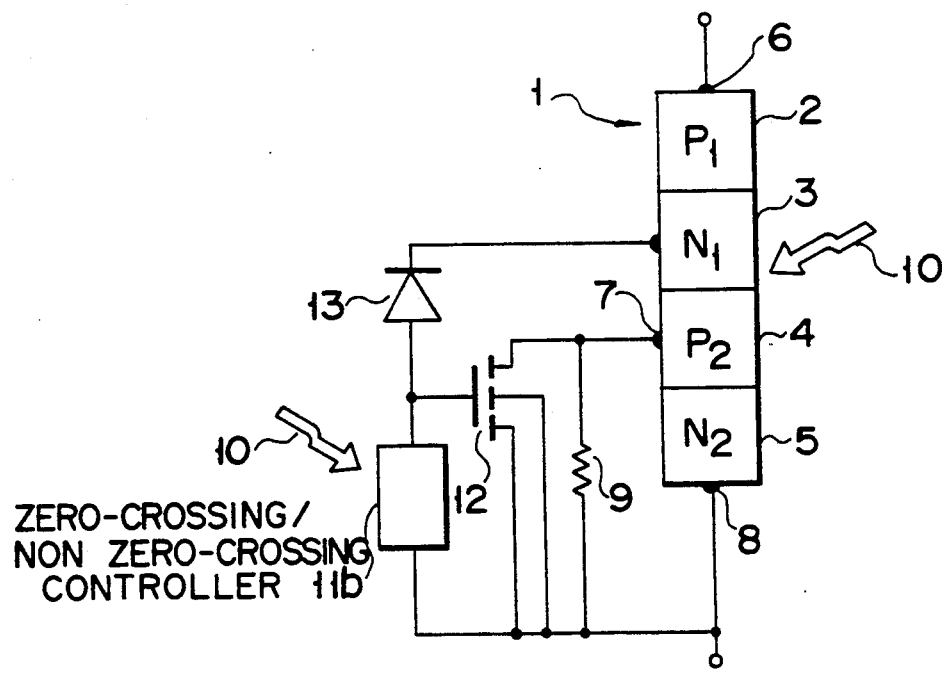
FIG. 19 is a diagram illustrating a light-triggered switching circuit according to a fifth embodiment of the invention.

FIG. 19 is a circuit diagram illustrating a light-triggered switching circuit according to a fifth embodiment of the invention. As FIG. 19 shows, the circuit comprises a PNPN element 1, a resistor 9, a zero-crossing/non-zero-crossing controller 11b, an N-channel MOSFET 12, and a PN-junction diode 13. The drain and source of the MOSFET 12 are connected to the gate 7 and cathode 8 of the PNPN element 1, respectively. The gate of the MOSFET 12 is connected to the N-type base layer 3 of the PNPN element 1 by the PN-junction diode 13. The zero-crossing/non-zero-crossing controller 11b is connected between the gate and source of the MOSFET 12.

Figure 20:
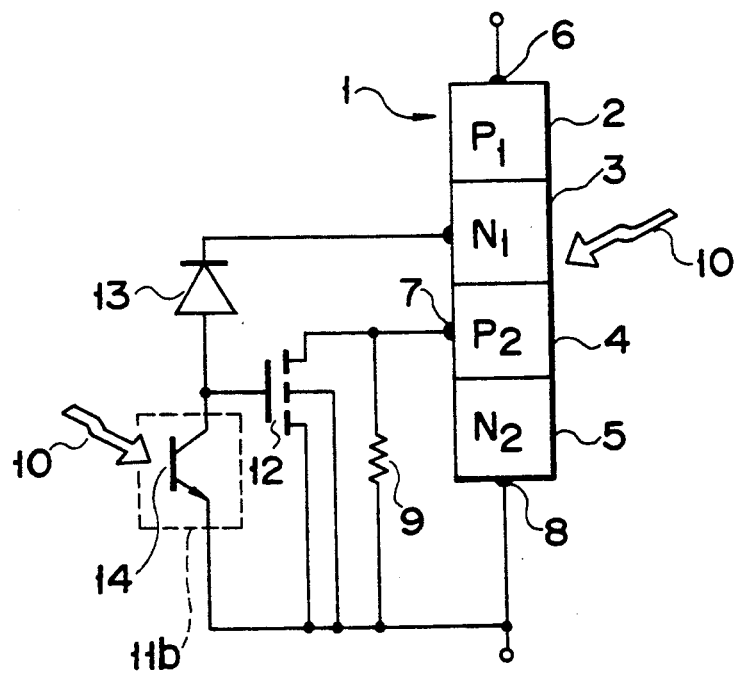
FIGS. 20 and 21 illustrate, in detail, zero-crossing/non-zero-crossing controller which can be incorporated in the circuit shown in FIG. 19.
Figure 21:
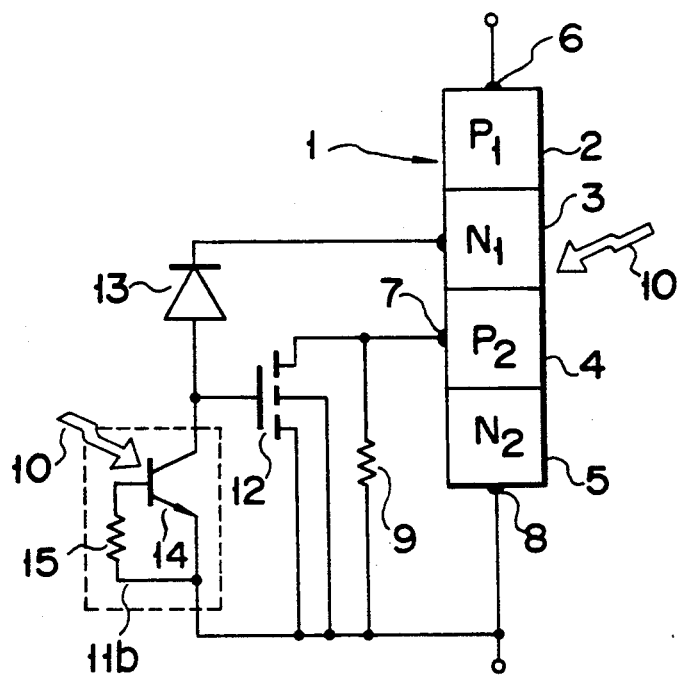

FIGS. 20 and 21 show, in detail, zero-crossing/non-zero-crossing controllers which can be incorporated in the light-triggered switching circuit shown in FIG. 19.

The controller 11b shown in FIG. 20 is comprised of an NPN-type phototransistor 14 having a collector and an emitter which are connected to the gate and source of an N-channel MOSFET 12, respectively. The controller 11b shown in FIG. 21 is identical to that one shown in FIG. 20, except that a resistor 15 is coupled between the base and emitter of the NPN-type phototransistor 14.

Figure 22:
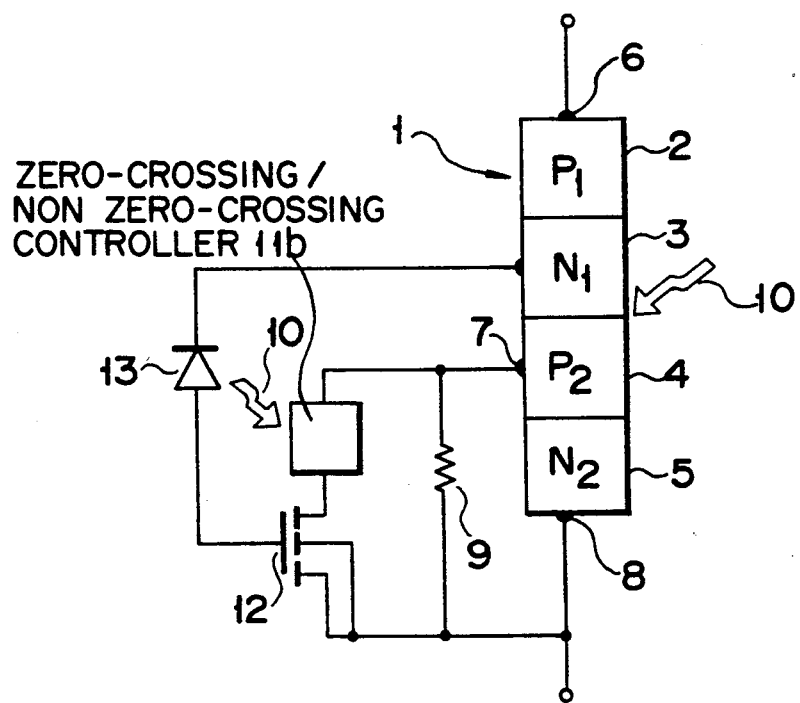
FIG. 22 is a diagram showing a light-triggered switching circuit according to a sixth embodiment of the present invention.

FIG. 22 illustrates a light-triggered switching circuit according to a sixth embodiment of the present invention. As is shown in this figure, the circuit comprises a light-activated PNPN element 1, a resistor 9, a zero-crossing/non-zero-crossing controller 11b, an N-channel MOSFET 12, and a PN-junction diode 13. The resistor 9 is connected between the gate 7 and cathode 8 of the PNPN element 1, for adjusting the photosensitivity of the PNPN element 1. The source of the MOSFET 12 is connected to the cathode 8 of the PNPN element 1. The gate of the MOSFET 12 is coupled to the N-type base layer 3 of the PNPN element 1 by the PN-junction diode 13. The zero-crossing/non-zero-crossing controller 11b is connected between the drain of the MOSFET 12 and the gate 7 of the PNPN element 1.

FIGS. 23 and 24 illustrate, in detail, two zero-crossing/non-zero-crossings controllers which can be incorporated in the light-triggered switching circuit shown in FIG. 22.

The zero-crossing/non-zero-crossing controller 11b shown in FIG. 23 comprises one NPN-type phototransistor 14 having the emitter connected to the drain of an N-channel MOSFET 12, and a collector connected to the gate 7 of an PNPN element 1.

The zero-crossing/non-zero-crossing controller 11b illustrated in FIG. 24 is identical to that one shown in FIG. 23, except that a resistor 15 is connected between the base and emitter of the NPN-type phototransistor 12, for adjusting the photosensitivity of the phototransistor 12.

As may be understood from the various embodiments described above, the present invention can provide a multi-function, light-triggered switching circuit which performs either a zero-crossing operation or a non-zero-crossing operation, in accordance with the amount of the light it receives.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. An optical radiation-triggered switching circuit, adapted for receiving a first radiation having an intensity of at least a first level and less than a second level and for receiving a second radiation having an intensity of at least the second level, comprising:

a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation;

a resistor connected between the P-type base layer and the N-type emitter layer; and means, coupled between the P-type emitter layer and the N-type emitter layer, for controlling the PNPN element including first means for enabling the PNPN element to trigger only when a voltage between the P-type emitter layer and the N-type emitter layer if lower than a predetermined value when the first radiation is received by the switching circuit, and second means for enabling the PNPN element to trigger independently of whether the voltage between the P-type emitter layer and the N-type emitter layer is lower than the predetermined value when the second radiation is received by the switching circuit.

2. The circuit according to claim 1, wherein the second means includes means responsive to the second radiation being several times greater than the first level.

3. The circuit according to claim 1, wherein said control means includes a MOS FET having a gate, a drain connected to said P-type base layer and a source connected to said N-type emitter layer; a diode coupled between said P-type emitter layer and the gate of said MOS FET; and a phototransistor having a base, a collector connected to the gate of said MOS FET, and an emitter connected to the source of said MOS FET, said phototransistor being structured so that it is not turned on by the first radiation and is turned on by the second radiation.

4. The circuit according to claim 3, further comprising a resistor connected between the base and emitter of said phototransistor.

5. The circuit according to claim 1, wherein said control means includes a MOS FET having a gate, a drain, and a source connected to said N-type emitter layer; a diode connected between said P-type emitter layer and the gate of said MOS FET; and a phototransistor having a base, a collector connected to said P-type base layer, and an emitter connected to the drain of said MOS FET, said phototransistor being structured so that it is not turned on by the first radiation and is turned on by the second radiation.

6. The circuit according to claim 5, further comprising a resistor connected between the base and emitter of said phototransistor.

7. An optical radiation-triggered switching circuit, adapted for receiving a first radiation having an intensity of at least a first level and less than a second level and for receiving a second radiation having an intensity of at least the second level, comprising:

a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation;

a resistor connected between the P-type base layer and the N-type emitter layer; and means, coupled between the N-type base layer and the N-type emitter layer, for controlling the PNPN element including first means for enabling the PNPN element to trigger only when a voltage between the P-type emitter layer and the N-type emitter layer is lower than a predetermined value when the first radiation is received by the switching circuit, and second means for enabling the PNPN element to trigger independently of whether the voltage between the P-type emitter layer and the N-type emitter layer is lower than the predetermined value when the second radiation is received by the switching circuit.

8. The circuit according to claim 7, wherein the second means includes means responsive to the second radiation being several times greater than the first level.

9. The circuit according to claim 7, wherein said control means includes a MOS FET having a gate, a drain connected to said P-type base layer, and a source connected to said N-type emitter layer; a diode coupled between said P-type emitter layer and the gate of said MOS FET; and a phototransistor having a base, a collector connected to the gate of said MOS FET, and an emitter connected to the source of said MOS FET, said phototransistor being structured so that it is not turned on by the first radiation and is turned on by the second radiation.

10. The circuit according to claim 9, further comprising a resistor connected between the base and emitter of said phototransistor.

11. The circuit according to claim 7, wherein said control means includes a MOS FET having a gate, a drain, and a source connected to said N-type emitter layer; a diode connected between said N-type base layer and the gate of said MOS FET; and a phototransistor having a base, a collector connected to said P-type base layer, and an emitter connected to the drain of said MOS FET, said phototransistor being structured so that it is not turned on by the first radiation and is turned on by the second radiation.

12. The circuit according to claim 11, further comprising a resistor connected between the base and emitter of said phototransistor.

13. An optical radiation-triggered switching circuit, adapted for receiving a first radiation having an intensity of at least a first level and less than a second level and for receiving a second radiation having an intensity of at least the second level, comprising:

a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation;

a resistor connected between the P-type base layer and the N-type emitter layer; and a MOS FET having a gate, a drain connected to the P-type base layer, and a source connected to the N-type emitter layer;

a diode connected between the P-type emitter and the gate of the MOS FET; and means, coupled between the gate and source of the MOS FET, for controlling the PNPN element including first means for enabling the PNPN element to trigger only when a voltage between the P-type emitter layer and the N-type emitter layer is lower than a predetermined value when the first radiation is received by the switching circuit, and second means for enabling the PNPN element to trigger independently of whether the voltage between the P-type emitter layer and the N-type emitter layer is lower than the predetermined value when the second radiation is received by the switching circuit.

14. The circuit according to claim 13, wherein the second means includes means responsive to the second radiation being several times greater than the first level.

15. The circuit according to claim 13, wherein said control means includes a MOS FET having a gate, a drain connected to said P-type base layer, and a source connected to said N-type emitter layer; a diode coupled between said P-type emitter layer and the gate of said MOS FET; and a phototransistor having a base, a collector connected to the gate of said MOS FET, and an emitter connected to the source of said MOS FET, said phototransistor being structured so that it is not turned on by the first radiation and is turned on by the second radiation.

16. The circuit according to claim 15, further comprising a resistor connected between the base and emitter of said phototransistor.

17. An optical radiation-triggered switching circuit, adapted for receiving a first radiation having an intensity of at least a first level and less than a second level and for receiving a second radiation having an intensity of at least the second level, comprising:

a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation; a MOS FET having a gate, a drain connected to the P-type base layer, and a source connected to the N-type emitter layer;

a resistor connected between the P-type base layer and the N-type emitter layer;

a MOS FET having a gate, a drain and a source connected to the N-type emitter layer;

a diode connected between the P-type emitter layer and the gate of the MOS FET; and means, connected between the P-type base layer and the drain of the MOS FET, for controlling the PNPN element including first means for enabling the PNPN element to trigger only when a voltage between the P-type emitter layer and the N-type emitter layer is lower than a predetermined value when the second radiation is received by the switching circuit, and second means for enabling the PNPN element to trigger independently of whether the voltage between the P-type emitter layer and the N-type emitter layer is lower than the predetermined value when the first radiation is received by the switching circuit.

18. The circuit according to claim 17, wherein the first means includes means responsive to the second radiation being several times greater than the first level.

19. The circuit according to claim 17, wherein said control means includes a phototransistor having a base, a collector connected to said P-type base layer, and an emitter connected to the drain of said MOS FET, said phototransistor being structured so that it is not turned on by the first radiation and is turned on by the second radiation.

20. The circuit according to claim 19, further comprising a resistor connected between the base and emitter of said phototransistor.

21. An optical radiation-triggered switching circuit, adapted for receiving a first radiation having an intensity of at least a first level and less than a second level and for receiving a second radiation having an intensity of at least the second level, comprising:

a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation;

a resistor connected between the P-type base layer and the N-type emitter layer; and a MOS FET having a gate, a drain connected to the P-type base layer, and a source connected to the N-type emitter layer;

a diode connected between the N-type base layer and the gate of the MOS FET; and means, coupled between the gate and source of the MOS FET, for controlling the PNPN element including first means for enabling the PNPN element to trigger only when a voltage between the P-type emitter layer and the N-type emitter layer is lower than a predetermined value when the first radiation is received by the switching circuit, and second means for enabling the PNPN element to trigger independently of whether the voltage between the P-type emitter layer and the N-type emitter layer is lower than the predetermined value when the second radiation is received by the switching circuit.

22. The circuit according to claim 21, wherein the first means includes means responsive to the second radiation being several times greater than the first level.

23. The circuit according to claim 21, wherein said control means includes a phototransistor having a base, a collector connected to the gate of said MOS FET, and an emitter connected to the source of said MOS FET, said phototransistor being structured so that it is not turned on by the first radiation and is turned on by the second radiation.

24. The circuit according to claim 23, further comprising a resistor connected between the base and emitter of said phototransistor.

25. An optical radiation-triggered switching circuit, adapted for receiving a first radiation having an intensity of at least a first level and less than a second level and for receiving a second radiation having an intensity of at least the second level, comprising:
- a PNPN element, including a P-type emitter layer, an N-type base layer juxtaposed to the P-type emitter layer, a P-type base layer juxtaposed to the N-type base layer, and an N-type emitter layer juxtaposed to the P-type base layer, the PNPN element being triggerable by either the first radiation or the second radiation;
- a resistor connected between the P-type base layer and the N-type emitter layer; and
- a MOS FET having a gate, a drain, and a source connected to the N-type emitter layer;
- a diode connected between the N-type base layer and the gate of the MOS FET; and
- means, coupled between the P-type base layer and the drain of the MOS FET, for controlling the PNPN element including
  - first means for enabling the PNPN element to trigger only when a voltage between the P-type emitter layer and the N-type emitter layer is lower than a predetermined value when the second radiation is received by the switching circuit, and
  - second means for enabling the PNPN element to trigger independently of whether the voltage between the P-type emitter layer and the N-type emitter layer is lower than the predetermined value when t he first radiation is received by the switching circuit.

26. The circuit according to claim 25, wherein the first means includes
- means responsive to the second radiation being several times greater than the first level.

27. The circuit according to claim 25 wherein said control means includes a phototransistor having a base, a collector connected to said P-type base layer, and an emitter connected to the drain of said MOS FET, said phototransistor being structured so that it is not turned on by the first radiation and is turned on by the second radiation.

28. The circuit according to claim 27, further comprising a resistor connected between the base and emitter of said phototransistor.

* * * * *

UNITED STATES PATENT AND TRADEMARK OFFICE
CERTIFICATE OF CORRECTION

PATENT NO. : 5,148,253
DATED : September 15, 1992
INVENTOR(S) : Akihiro Kumura

It is certified that error appears in the above-indentified patent and that said Letters Patent is hereby corrected as shown below:

Abstract, line 14, after "and" change "is" to --it--.

Claim 1, column 9, line 24, change "if" to --is--.

Claim 13, column 11, line 8, after "emitter" insert --layer--.

Claim 25, column 14, line 9, change "t he" to --the--.

Signed and Sealed this

Fourteenth Day of December, 1993

Attest:

BRUCE LEHMAN

*Attesting Officer*    *Commissioner of Patents and Trademarks*